(12) United States Patent
Hoang et al.

(10) Patent No.: US 6,357,026 B1
(45) Date of Patent: Mar. 12, 2002

(54) SYSTEM AND METHOD FOR AT-SPEED INTERCONNECT TESTS

(75) Inventors: Tuan M. Hoang, Westminster; Samuel Chu, West Hills, both of CA (US)

(73) Assignee: The Boeing Company, Chicago, IL (US)

(*) Notice: Subject to any disclaimer, the term of this patent is extended or adjusted under 35 U.S.C. 154(b) by 0 days.

(21) Appl. No.: 09/225,950

(22) Filed: Jan. 5, 1999

(51) Int. Cl.[7] ............................................... G01R 31/28
(52) U.S. Cl. ........................ 714/727; 714/728; 714/732
(58) Field of Search ................................. 714/724, 727, 714/726, 728, 729, 732, 733, 738

(56) References Cited

U.S. PATENT DOCUMENTS

| | | | |
|---|---|---|---|
| 5,369,648 A | * 11/1994 | Nelson .......................... | 714/738 |
| 5,568,492 A | 10/1996 | Flint et al. .................... | 714/724 |
| 5,570,375 A | * 10/1996 | Tsai et al. ..................... | 714/726 |
| 5,701,308 A | * 12/1997 | Attaway et al. ............. | 714/726 |
| 5,862,152 A | 1/1999 | Handly et al. ............... | 714/727 |
| 6,000,051 A | 12/1999 | Nadeau-Dostie et al. ... | 714/727 |
| 6,029,263 A | 2/2000 | Gibson ......................... | 714/726 |
| 6,145,105 A | 11/2000 | Nadeau-Dostie et al. ... | 714/726 |

* cited by examiner

Primary Examiner—David Ton
(74) Attorney, Agent, or Firm—Terje Gudmestad

(57) ABSTRACT

A system and method for detecting speed related defects in an electronic assembly includes application specific integrated circuits (ASICs) designed with registered I/O's to provide true at-speed testing of the electronic assembly. An interconnect test engine and a test access port controller control the generation of a progressive binary patterns. The test engine receives captured data from the other ASICs in response to the binary patterns. The method includes generating binary progressive scan patterns for the output registers of one ASIC that are scanned and captured at the input registers of another ASIC. The test results are stored in a multiple input shift register (MISR) where they can be accessed for examination and diagnostic evaluations.

10 Claims, 2 Drawing Sheets

SYSTEM AND METHOD FOR AT-SPEED INTERCONNECT TESTS

TECHNICAL FIELD

This invention relates to an electronic assembly, such as a multi-chip module. In particular, the present invention relates to testing an electronic assembly having an Application Specific Integration Circuit (ASIC).

BACKGROUND ART

Testing an electronic assembly is a necessary step to ensure the accuracy and reliability of the assembly. Currently, testing involves long complicated algorithms and expensive test systems that cannot be executed at system speed. Current test methods are intrusive and interfere with the operation of the electronic assembly.

A static interconnect test is used to obtain test data. However, the test must be executed in a slow clock input environment, which does not detect speed-related defects. In addition, the test results must be monitored serially at an output by external equipment.

A test exists that can be performed at speed in the system's clock environment, but not at true system speed. In "truly at-speed" testing, testing is performed in the system's true native clock environment and at system clock frequencies. One drawback to such a system is that the test is intrusive to the functional operation of the electronic assembly. Bypass structures in the electronic assembly's ASIC burn power and burden critical systems with timing penalties during the test.

SUMMARY OF THE INVENTION

It is an object of the present invention to detect speed-related defects in an electronic assembly at system and sub-system levels.

It is another object of the present invention to provide true at-speed testing of an electronic assembly.

The present invention is a system and method for detecting speed related defects in an electronic assembly at system and sub-system levels. The system of the present invention applies to ASICs designed with registered I/O's to provide true at-speed testing of the electronic assembly. The system also includes an interconnect test engine and a test access port controller.

The method of the present invention generates binary progressive scan patterns for the output registers of one ASIC that are scanned and captured at the input registers of another ASIC. The test results are stored in a multiple input shift register (MISR) where they can be accessed for examination and diagnostic evaluations.

The system and method of the present invention allows all of the ASICs of the electronic assembly to participate simultaneously. The method of the present invention includes a two vector three scan or capture operation that does not require complex logic or algorithms. Because the method and system of the present invention are non-intrusive, there are no timing penalties to the functional signals of the electronic assembly and there is no extra power consumption by the test during the functional operations of the electronic assembly.

One advantage of the present invention is that because the self-test is autonomous within each ASIC, no further external components are added to the circuitry to implement a test. The system can satisfy "at speed" interconnect tests in an electronic assembly with ASICs having unidirectional input and output pins. The direction of these pins can be hardwired in an ASICs. Or, in case when transceivers are available, the direction can be programmed by using the TAP controller. Multiple passes of the test sequence from this invention will allow both directions to be tested.

A more complete understanding of the present invention can be determined from the following detailed description when taken in view of the attached drawings and the claims appended hereto.

BEST MODE(S) FOR CARRYING OUT THE INVENTION

The present invention will be described in terms of two Application Specific Integration Ciruits (ASICs) for simplicity in understanding the system and method of the present invention. However, it is to be understood that the system and method of the present invention is applicable to more than two ASICs in which all ASICs of an electronic assembly participate simultaneously during the test method of the present invention.

Figure 1:
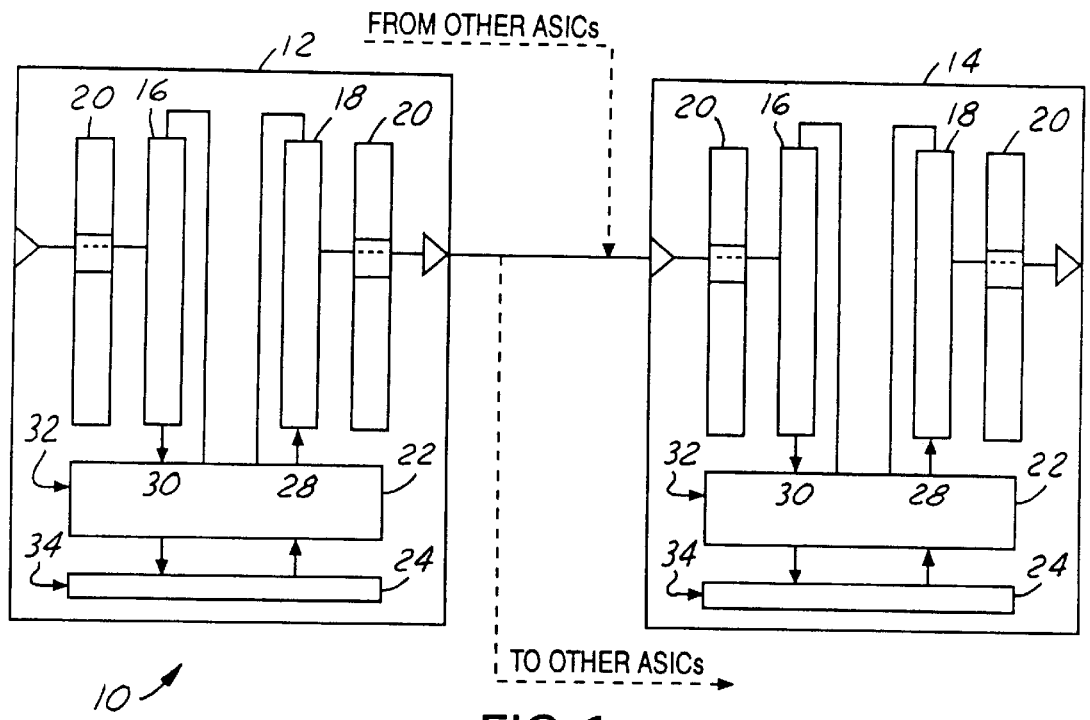
FIG. 1 is a block diagram of two ASICs of the system of the present invention.

Referring to FIG. 1, a portion of the system 10 of the present invention is shown. A first, or driving, application specific integrated circuit (ASIC) 12 is shown interconnected with a second, or receiving, ASIC 14. Each ASIC 12, 14 has scannable input registers 16 and scannable output registers 18. In a multi-clock domain system, registers 16 and 18 are grouped for each domain. Registers 16 and 18 receive dedicated stimulus from generator 28 and send results to MISR 30 from dedicated channels. Input and output registers 16, 18 each have adjacent boundary scan cells 20. ASIC 12 has a test engine 22 and a test access port controller 24.

Test engine 22, also called the interconnect built-in self-test, or IBIST, includes a pattern generator 28 and a multiple input shift register (MISR) 30. Pattern generator 28 is in communication with output registers 18 of ASIC 12. Pattern generator 28 of ASIC 12 generates a progressive binary pattern to invoke responses in the form of test or capture data at ASIC 14 in system 10. Also, input registers 16 of ASIC 12 are in communication with MISR 30 when it receives stimulus from another ASIC. Multiple clock domains 32 are testable provided their frequencies are multiples of each other. In that case, for each domain, progressive binary patterns are generated at pattern generator 28, and responses are captured at MISR 30. System 10 allows the test to be executed using the fastest free running clock input to system 10.

Test access port controller or TAP controller 24 is in communication with IBIST 22. TAP controller 24 performs functions that control IBIST 22 including the dedicated interface instruction operation codes for IBIST 22, whereby TAP controller 24 invokes IBIST 22 and monitors when the testing is complete. TAP controller 24 is also used to scan out MISR values. Additionally, TAP controller 24 is used to set the direction and state control of all of the primary inputs and outputs excluding the untestable inputs, and is used for general housekeeping, mode setting and diagnostic controls.

TAP controller 24 has a clock input 34. Clock input is present to conform with the IEEE 1149.1 standard for test inputs. Clock input 34 may be used for other testing purposes beyond the scope of this invention.

Figure 2:
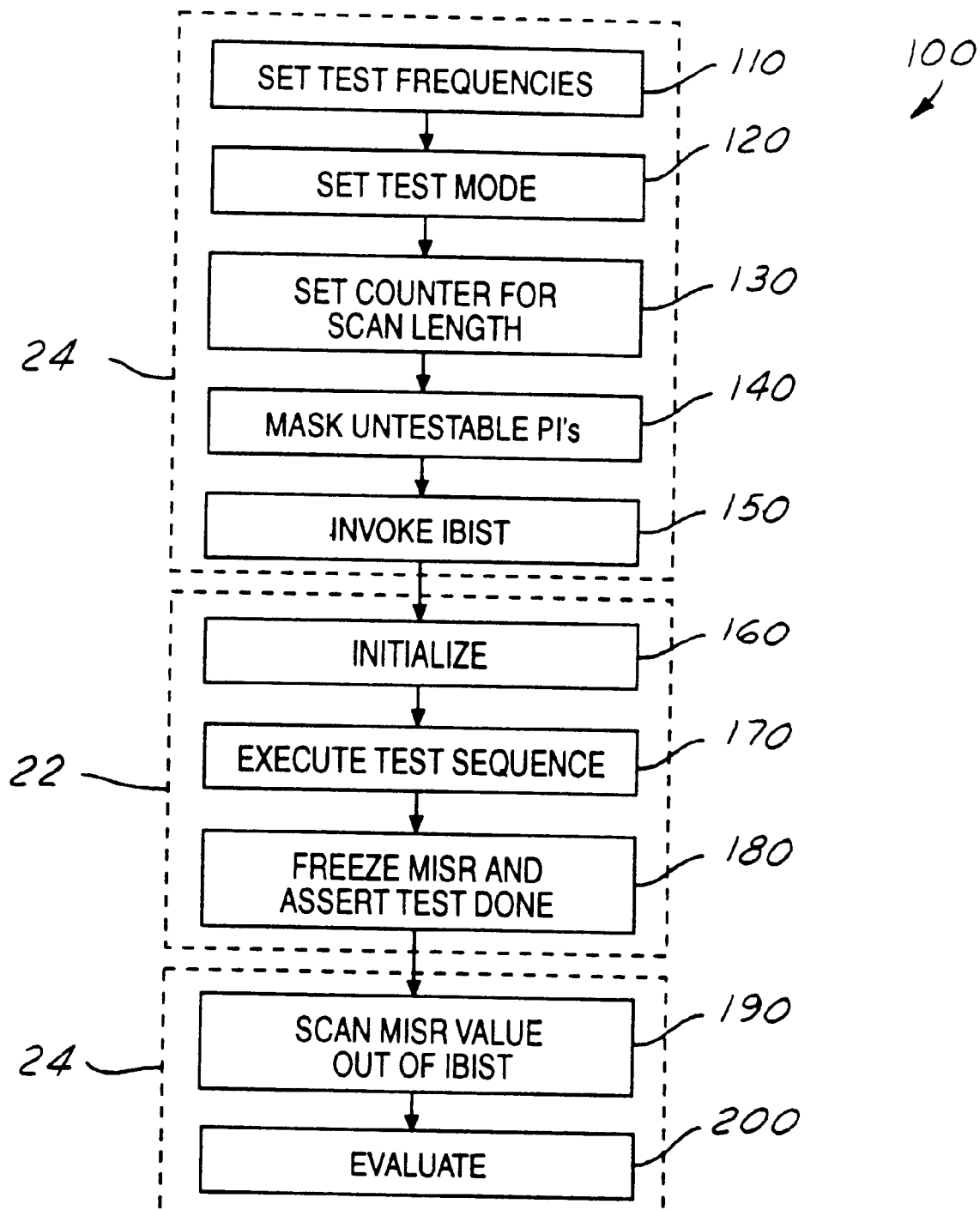
FIG. 2 is a flow chart of the method of the present invention.

Referring now to FIG. 2, the method 100 of the present invention describes in detail the interrelationship of the IBIST 22 and TAP controller 24. In general, TAP controller 24 sets up and invokes IBIST 22 to perform the testing procedure, IBIST 22 executes the test, and the TAP controller 24 retrieves and evaluates the test data obtained during the testing procedure.

TAP controller 24 sets the desired test frequencies 110 of the system clock input. Testing is preferably performed at the system clock speed. However, if multiple clocks are used in the system, the highest clock speed may be used. This operation can be done by way of a phase lock loop configuration or any other known method of clock setting. Tap controller 24 sets the test mode in IBIST 22 in step 120. In step 130, tap controller 24 sets the appropriate value into a scan length counter. The scan length value corresponds to the largest possible bit length of all the scan cells in chains 18 and 20 of the system so that the scan cells accommodate the largest possible amount of data from any other ASIC. TAP controller 24 also masks untestable primary inputs in step 140. Examples of untestable primary inputs include external RAM or open drain inputs.

TAP controller 24 then invokes IBIST 22 in step 150. Once invoked, the IBIST 22 initializes itself and MISR 30 for testing in step 160. In one aspect of the invention, IBIST engines in all the ASICs start the test sequence at the same cycle of the high speed clock, such that a repeatable signature can be collected at MISR 30 during the test. The test sequence is executed in step 170. The test sequence is described in further detail below.

Once the test is completed, the IBIST will freeze the value in MISR 30 and assert the test is done in step 180. Finally, the TAP controller 24 will scan the MISR value out of the IBIST in step 190, and evaluate the value in step 200.

Figure 3:
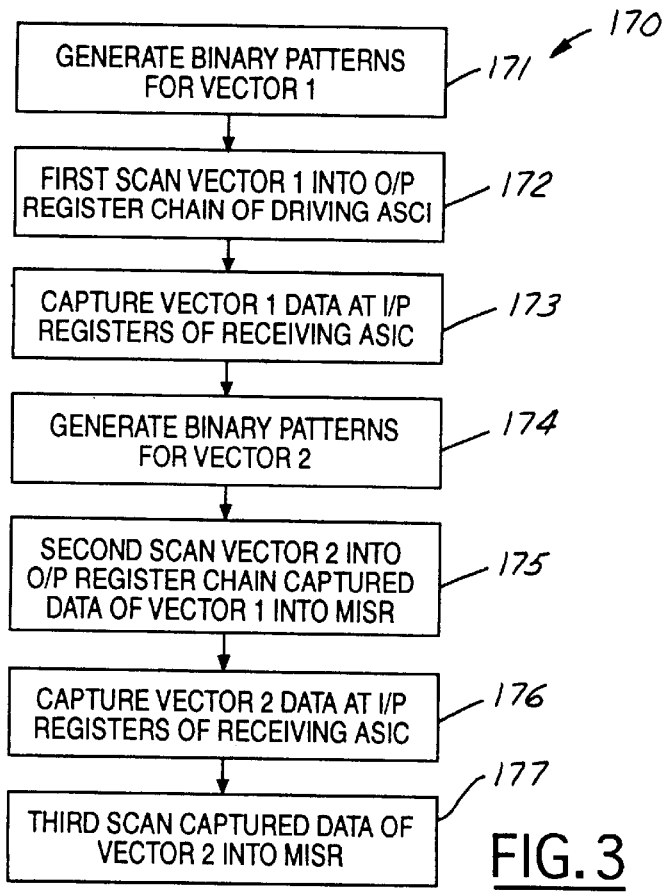
FIG. 3 is a flow chart of the test sequence of the present invention.

Referring now to FIG. 3, the test sequence 170 is preferably at a minimum a two vector, three scan operation. The first step of the test sequence is to generate a binary pattern for a first vector in step 171. Step 172 will scan or shift the first vector into the output registers 18 of the driving ASIC 12.

In step 173, the first vector data from the other ASICs of the system is then captured at the input registers 16 of receiving ASIC 14.

Binary patterns are then generated in step 174 for the second vector. A second scan in step 175 will scan or shift the second vector into the output register 18 of driving ASIC 12. The captured test data of the first vector is also scanned into MISR 30 of receiving ASIC 14. As controlled by IBIST 22, the scan operations from pattern generator 28 and into MISR 30 are simultaneous.

In step 176, the second vector data is captured at the input registers of the receiving ASIC 14. A signature may be developed based upon the two received sets of captured test data. In step 177, a third scan scans the captured test data or the signature of the second vector from MISR 30 into TAP controller 24. The signature or test data may then be analyzed to determine if the system is functioning properly.

In this manner, the captured data received is essentially a signature corresponding to the functionality of the system. The test not only tests for the presence of an electrical interconnection, but also tests for transitions from low to high values, as well as from high to low values.

The system can also be operated in a mode that singles out a certain ASIC for testing. In this mode, the operation of the bidirectional busses at the primary input and primary output pins of the ASIC may be verified.

While the best mode for carrying out the present invention has been described in detail, those familiar with the art to which this invention relates will recognize various alternative designs and embodiments for practicing the invention as defined by the following claims:

What is claimed Is:

1. A method for testing interconnections of an electronic assembly comprising the steps of:
   generating a first binary pattern for a first vector;
   shifting the first binary pattern into an output register;
   executing a first scan at input registers to transfer a first set of capture data into a multiple input shift register;
   generating a second binary pattern for a second vector;
   shifting the second binary pattern into an output register;
   executing a second scan at the input registers to transfer a second set of capture data into a multiple input shift register; and
   executing a third scan to transfer the first and second sets of capture data from the multiple input shift register to a test access port.

2. The method as claimed in claim 1 wherein the step of generating a second binary pattern comprises the step of generating a second binary pattern having a reversed polarity from the first binary pattern.

3. The method as claimed in claim 1 further comprising the step of writing to a scan length counter.

4. The method as claimed in claim 1 wherein said steps of executing a first scan and shifting the second binary pattern are performed simultaneously.

5. The method as claimed in claim 1 further comprising the step of developing an accumulative test signature from the first capture data and the second capture data.

6. The method as claimed in claim 5 wherein the step of scanning data from the multiple input shift register comprises scanning the test signature into a test access port.

7. A method for testing interconnections of an electronic assembly at system speed, said method comprising the steps of:
   a. setting test modes;
   b. writing to scan length counter;
   c. setting drive direction at bi-directional inputs and outputs;
   d. invoking interconnect built-in self test wherein said interconnect built-in self test comprises the steps of;
      i) initializing the interconnect self test;
      ii) initializing a multiple input shift register;
      iii) executing a test sequence; and
      iv) freezing said multiple input shift register; and
         scanning said multiple input shift register value for evaluation,
         wherein the step of executing a test sequence comprises,
            generating a first binary pattern for a first vector;
            shifting the first binary pattern into an output register;
            generating a second binary pattern for a second vector;
            shifting the second binary pattern into an output register;
            scanning first capture data of the first vector into a multiple input shift register;

scanning second capture data of the second vector into the multiple input shift register;

scanning data from the multiple input shift register into a test access port; and developing a test signature from the first capture data and the second capture data.

8. The method as claimed in claim 7 further comprising the step of setting frequencies to be tested.

9. The method as claimed in claim 7 wherein said steps of scanning first capture data and shifting said second binary pattern are performed simultaneously.

10. The method as claimed in claim 7 wherein the step of scanning data from the multiple input shift register comprises scanning the test signature into a test access port.

* * * * *

UNITED STATES PATENT AND TRADEMARK OFFICE
CERTIFICATE OF CORRECTION

PATENT NO.     : 6,357,026 B1
DATED          : March 12, 2002
INVENTOR(S)    : Tuan M. Hoang and Samuel Chu It is certified that error appears in the above-identified patent and that said Letters Patent is hereby corrected as shown below:

<u>Title page,</u>
Item [73], Assignee should read as follows:
-- Hughes Electronics Corporation, El Segundo, CA --

Signed and Sealed this

Eleventh Day of March, 2003

JAMES E. ROGAN
*Director of the United States Patent and Trademark Office*